US009325039B2

(12) United States Patent  
Guidal et al.

(10) Patent No.: US 9,325,039 B2  
(45) Date of Patent: Apr. 26, 2016

(54) SYSTEM AND METHOD FOR DETECTING VENTING OF A SEALED STORAGE CELL

(71) Applicant: SAFT, Bagnolet (FR)

(72) Inventors: Laurent Guidal, Latille (FR); Pascal Susset, Nieuil l'Espoir (FR); Nicolas Vigier, Vouille (FR)

(73) Assignee: SAFT, Bagnolet (FR)

( * ) Notice: Subject to any disclaimer, the term of this patent is extended or adjusted under 35 U.S.C. 154(b) by 279 days.

(21) Appl. No.: 13/864,931

(22) Filed: Apr. 17, 2013

(65) Prior Publication Data

US 2013/0280559 A1 Oct. 24, 2013

(30) Foreign Application Priority Data

Apr. 18, 2012 (FR) ..................................... 12 53560

(51) Int. Cl.  
*H01M 2/12* (2006.01)  
*H01M 10/48* (2006.01)  
*H01M 2/34* (2006.01)  
(Continued)

(52) U.S. Cl.  
CPC .............. *H01M 10/48* (2013.01); *H01M 2/12* (2013.01); *H01M 2/1241* (2013.01); *H01M 2/1276* (2013.01); *H01M 2/345* (2013.01); *H01M 10/425* (2013.01); *H01M 10/482* (2013.01); *H01M 10/488* (2013.01); *H05K 1/0268* (2013.01); *H01M 2/105* (2013.01); *H01M 10/0525* (2013.01); *H01M 10/34* (2013.01); *H01M 2200/20* (2013.01); *H05K 2201/0909* (2013.01); *H05K 2201/09063* (2013.01);

(Continued)

(58) Field of Classification Search  
CPC ............................ H01M 2/1241; H01M 2/34  
USPC .................................................. 429/71, 56, 82  
See application file for complete search history.

(56) References Cited

U.S. PATENT DOCUMENTS

| 5,609,972 A | * | 3/1997 | Kaschmitter et al. ........... 429/56 |
| 5,660,944 A | | 8/1997 | Sprengel et al. |
| 5,773,775 A | * | 6/1998 | Azema ........................ 200/61.08 |
| 2006/0019150 A1 | | 1/2006 | Rigobert et al. |

(Continued)

FOREIGN PATENT DOCUMENTS

| FR | 2 020 290 A1 | 7/1970 |
| FR | 2 718 290 A1 | 10/1995 |
| FR | 2 873 495 A1 | 1/2006 |
| JP | 2005-322471 A | 11/2005 |

(Continued)

OTHER PUBLICATIONS

European Search Report issued Jul. 16, 2013 in European Application No. 13164038.

*Primary Examiner* — Patrick Ryan  
*Assistant Examiner* — Julian Anthony  
(74) *Attorney, Agent, or Firm* — Sughrue Mion, PLLC

(57) ABSTRACT

In a system and method for detecting venting of a sealed storage cell, the sealed storage cell comprises a container with a sealing cap adapted to be detached from the container and move in the presence of gas overpressure inside the container to allow venting of the storage cell. The detection system comprises a printed circuit board with a central portion designed to be situated opposite the sealing cap, a peripheral portion surrounding the central portion and connected to the central portion by a hinge adapted to flex during movement of the sealing cap, and at least one frangible portion adapted to break upon movement of the sealing cap. An electrical printed track connects the peripheral portion to the central portion through the hinge and frangible portion(s), and is designed to be broken upon breaking of the frangible portion(s) following movement of the sealing cap.

14 Claims, 5 Drawing Sheets

(51) Int. Cl.
  *H01M 10/42*     (2006.01)
  *H05K 1/02*      (2006.01)
  *H01M 2/10*      (2006.01)
  *H01M 10/0525*   (2010.01)
  *H01M 10/34*     (2006.01)

(52) U.S. Cl.
  CPC ............ *H05K2201/09081* (2013.01); *H05K 2201/10037* (2013.01); *H05K 2203/175* (2013.01)

(56) References Cited

U.S. PATENT DOCUMENTS

2009/0111003 A1   4/2009   Kim et al.
2011/0223449 A1   9/2011   Rigobert et al.

FOREIGN PATENT DOCUMENTS

JP   2010-205471 A   9/2010

* cited by examiner

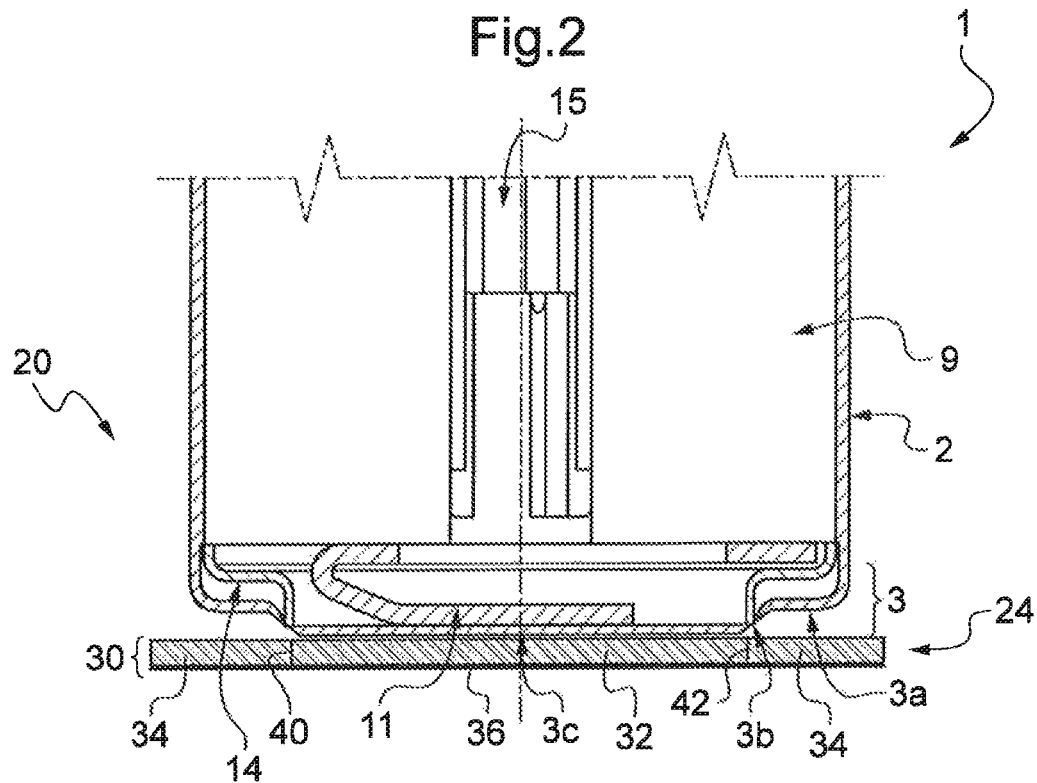
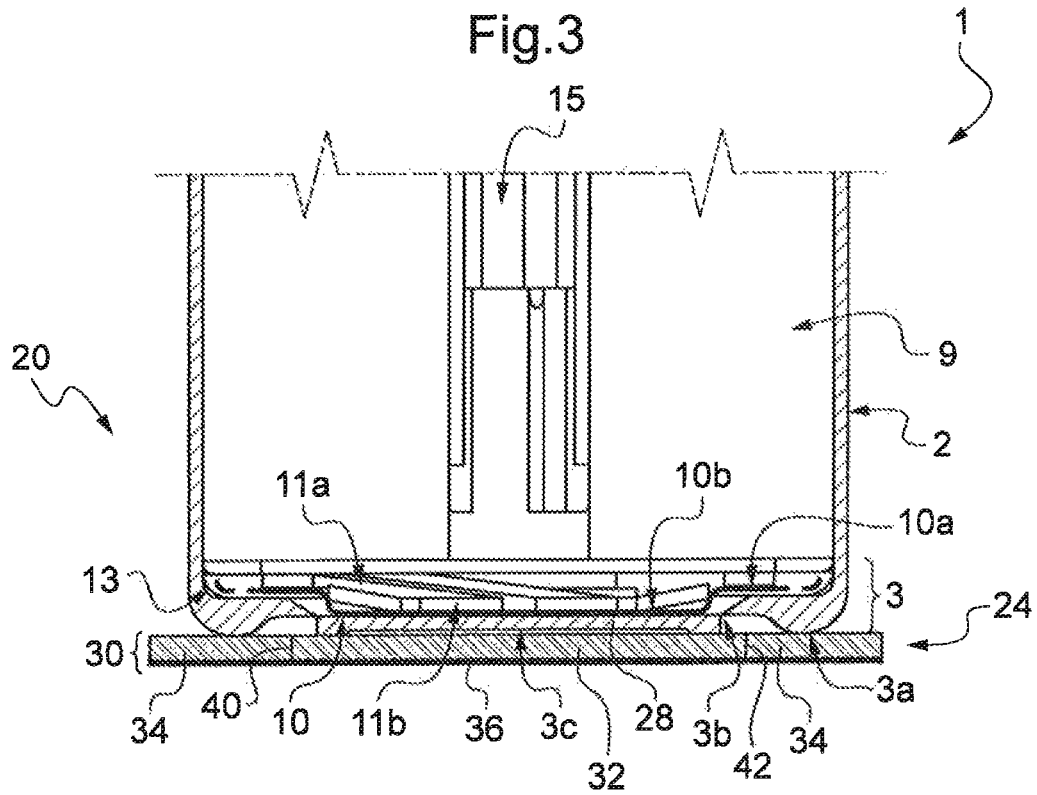

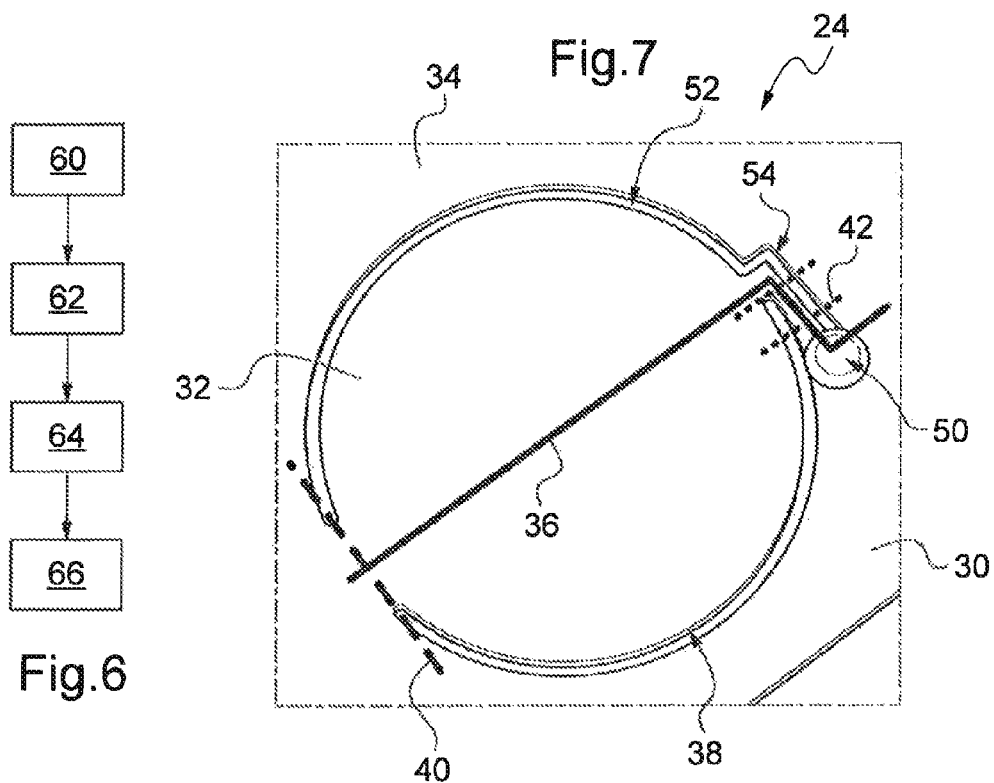
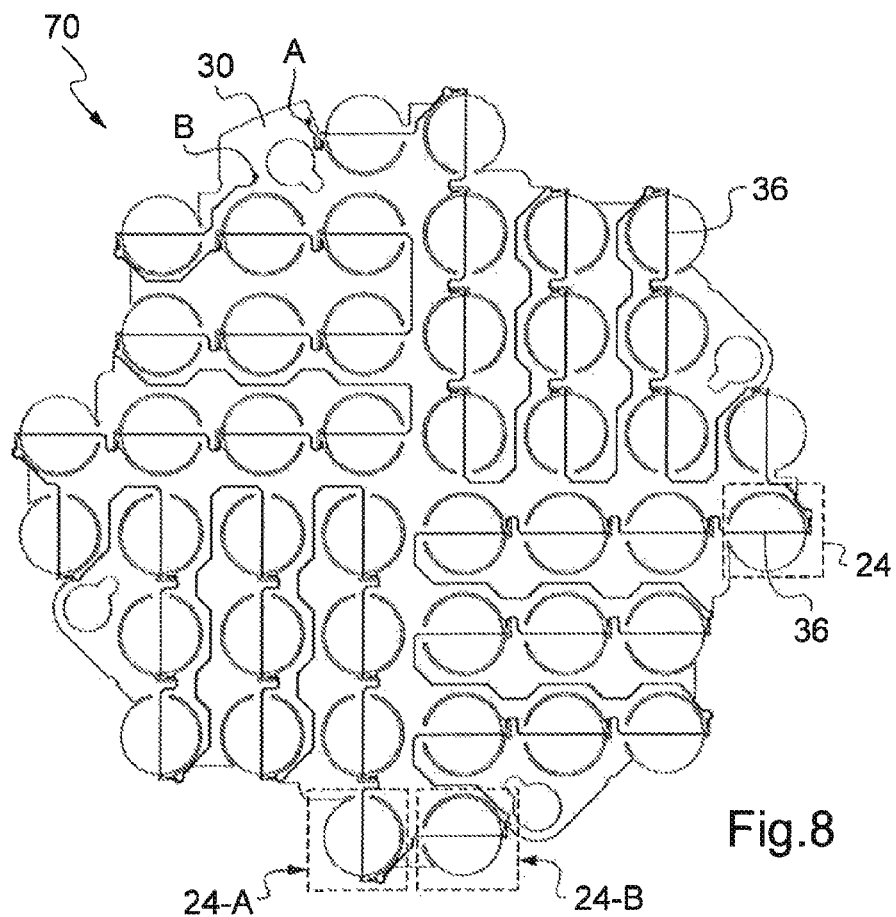

SYSTEM AND METHOD FOR DETECTING VENTING OF A SEALED STORAGE CELL

CROSS-REFERENCE TO RELATED APPLICATION

This application relates to and claims the benefit of priority from French Patent Application No. 12 53 560, filed on Apr. 18, 2012, the entire disclosure of which is incorporated herein by reference.

The present invention relates to a system and method for detecting venting of a sealed storage cell. The invention also relates to an assembly comprising a sealed storage cell and such a detection system and to apparatus having a plurality of assemblies of this type.

A definition of "venting" will be given later on in the description.

The invention concerns the field of sealed storage cells, especially rechargeable lithium-ion storage cells.

A sealed storage cell or electrochemical cell (these two terms are equivalent, the term storage cell will be used in the present description) comprises in known manner a container containing an electrode plate group, which electrode plate group comprises an alternation of positive and negative electrodes framing the separators. The electrode plate group is impregnated with electrolyte. Each electrode is composed of a metal current collector carrying on at least one of its faces an electrochemically active material. The electrode is electrically connected to an output terminal for current which ensures electrical continuity between the electrode and the external application to which the storage cell is associated. The electrode plate group is disposed in the container sealed by a lid.

The use of a sealed storage cell outside of its nominal conditions, such as during an accidental overload, short circuit, or upon exposure to a temperature above the maximum operating temperature, creates a risk of explosion. Indeed, such situations cause reactions in the electrochemistry that generate gas in the container of the cell. The accumulation of these gases causes an increase in the internal pressure of the cell, which can lead to violent bursting of the container and the projection of chemical compounds that are harmful and corrosive to the environment and people nearby.

Safety devices exist that prevent the accumulation of gas within the container of a sealed storage cell and allow their removal when the internal pressure exceeds a predetermined value. Some of these devices also have a function of circuit breaker, that is to say, they are also able to electrically and irreversibly isolate equipment connected to the cell.

French patent application FR-A-2,873,495 discloses a cell comprising a safety device combining the function of a safety valve and circuit breaker. A longitudinal sectional view of the storage cell is shown in FIG. 1.

The cell 1 comprises a container 2 having a cylindrical side wall closed at one end by a bottom 3 and at the opposite end 4 by a lid 5. The base 3 is composed of three parts: a peripheral portion 3a electrically connected to the side wall, a sealing cap 3c, and a thinned portion 3b connecting the sealing cap to the peripheral portion.

The cell further comprises an alternation of positive and negative electrodes respectively connected to the current output terminals 6, 7 and an electrode plate group 9. The electrodes and the electrode plate group are arranged in the container 2.

A first flat connection 11 connects the positive electrode of the electrode plate group 9 to the bottom wall of the container, the bottom wall of the container being electrically conductive with the lid 5. The positive current output 6 terminal is welded onto the lid.

A second flat connection 12 connects the negative electrode of the electrode plate group to the negative current output terminal 7. The negative output terminal 7 passes through the lid 5. A seal 8 electrically insulates the negative current output terminal 7 from the lid 5.

An O-shaped ring 14 is placed between the electrode plate group and the bottom of the container. It serves as an electrical insulator to prevent electrical contact between the edge of a negative electrode of the electrode plate group and the wall of the container connected to the positive terminal, which would lead to a short circuit after the safety device has been activated.

Tearing of the thinned portion 3b allows detaching of the sealing cap 3c from the peripheral portion 3a and is adapted to interrupt electrical conduction between the electrodes of one polarity and their associated current output terminal by disconnecting the sealing cap 3c from peripheral portion 3a. The electrode plate group 9 is supported on the connection part 11 in the bottom 3 of the container 2.

In the presence of excess pressure inside the container 2, the thinned portion 3b is torn and the electrode plate group which bears on the sealing cap 3c through the connecting part 11 moves towards the bottom 3 of the container, tearing the thinned portion in its entirety in order to break the circuit between the positive electrode of the electrode plate group and the container lid.

This phenomenon is called "venting". Therefore "venting" implies separation of the sealing cap 3c from the rest of the container 2 when the pressure of gas within the container is excessive.

The sealing cap 3c and its arrangement in the container 2 are dimensioned to allow this separation at a given gas pressure. For example, these parts are dimensioned so that the sealing cap 3c disengages for pressures greater than or equal to 8 bars.

Thus, an excess pressure within the container causes a break in the circuit between the two electrodes resulting in a zero voltage across the terminals of the cell.

However, other causes may bring about the same effect of loss of all voltage at the terminals of the cell, such as internal rupture of the flat connection 12. A similar thing happens if a fuse or weld is out of service.

A disadvantage of this type of cell is that it is not possible to know the cause of the appearance of zero voltage across the cell terminals.

SUMMARY OF THE INVENTION

There is therefore a need for a detection system for a sealed storage cell adapted to detect specifically when the container of the storage cell has been subject to excess pressure and thereby reliably indicate when zero voltage at the terminals of the cell is the result of excess pressure.

For this purpose and according to a first aspect, the present invention provides a venting detection system for a sealed storage cell, the sealed storage cell comprising a container comprising a sealing cap adapted to be detached from the rest of the container and to move in the presence of excessive gas pressure within the container to allow the venting of said sealed storage cell, the detection system comprising a printed circuit board comprising:

a central portion delimited by a circumference designed to be situated facing said sealing cap a peripheral portion surrounding the central portion and connected to said central portion by connecting means consisting of:
 a hinge adapted to flex during movement of the sealing cap, and
 at least one frangible portion adapted to break upon movement of the sealing cap an electrical printed track connecting said peripheral portion to the central portion through the hinge and at least one frangible portion, the electrical printed track being adapted to be broken through breaking of the frangible portion upon movement of the sealing cap.

Such a system for venting of a sealed storage cell permits detection of the occurrence of overpressure in the container of the storage cell. This detection is performed using a mechanically-operated device without the use of electronic means of the pressure or gas sensor type and thus without particularly unnecessary energy consumption under nominal conditions of use of the cell.

This system also makes it possible to discriminate simply, quickly and reliably the reason for a drop in voltage across the terminals of the storage cell by identifying whether this is due to overpressure or not.

In the context of the present invention, the terms below are defined as follows:
 "detachment" the at least partial separation of a first part from a second part to which the first part was connected before the separation, and
 "printed circuit board" (PCB) a board composed principally of an epoxy resin reinforced with glass fiber being used as a carrier to allow the electrical interconnection of electronic components; such board is usually lined with a thin first layer of copper on one or both sides and coated with a photoresist layer and the layers are processed to preserve the copper tracks at desired locations; and the copper layers are etched by a chemical process to obtain a set of tracks.

According to preferred embodiments, the system for venting of a storage cell according to the invention comprises one or more of the following characteristics, taken separately or in combination:
 the central portion and the peripheral portion are connected by continuity of material by the connecting means over a distance less than or equal to 25% of the circumference of the central portion.
 the hinge and the frangible portion or portions are angularly spaced by an angle substantially equal to 180° relative to the geometric center of the central portion.
 a line of cut out dots forms the hinge following a mean straight line connecting the two ends of the hinge.
 a line of cut out dots forms the or each frangible portion.
 the line of cut out dots forming the hinge and the line of cut out dots forming the frangible portion are perpendicular one with respect to the other.
 the shape of the central portion is circular or hexagonal.
 the detection system comprises a spacer designed to ensure contact between the sealing cap of the container and the central portion of the printed circuit board.
 the thickness of the printed circuit board is between 0.1 and 2 mm, and
 the central portion comprises a disc extended by a tab, the tab having two frangible portions and being connected through continuity of material to the peripheral portion, the electrical printed track passing through the tab.

According to a second aspect, the invention provides an assembly comprising a sealed storage cell and the above detection system, wherein the sealed storage cell comprises a container comprising a movable member adapted to move in the presence of gas overpressure inside the container, the central portion of the detection system being fixed facing the movable member of the container.

According to preferred embodiments, the assembly according to the invention comprises a deformable membrane adapted to deform when there is excess pressure of gas within the container, deformation thereof causing a sealing cap to become detached from the rest of the container.

In a third aspect, the invention provides apparatus comprising at least two of the above assemblies wherein the sealed cells of the assemblies are electrically connected in parallel, the detection systems of the assemblies are electrically connected in series, the printed circuit boards of the detection systems forming a single common board.

In a fourth aspect, the invention also provides a detection method using a venting detection system for a sealed storage cell, the sealed storage cell comprising a container comprising a sealing cap adapted to be detached from the rest of the container and move in the presence of gas overpressure inside the container, the method comprising the steps of:
 permitting mechanical movement of the sealing cap in the presence of excess pressure inside the container, and
 simultaneously upon movement of the sealing cap permitting folding of the hinge and breaking of the frangible portion thereby bringing about breaking of the electrical printed track.

According to preferred embodiments of the venting detection method according to the invention, the breaking of the electrical printed track triggers a warning signal informing of the breaking of the electrical printed track.

BRIEF DESCRIPTION OF THE DRAWINGS

Other features and advantages of the invention will become apparent upon reading the following description of a preferred embodiment of the invention, given by way of example and with reference to the accompanying drawings:

FIG. 2 shows a partial longitudinal section of a first embodiment of an assembly comprising a storage cell and a detection system according to the invention in nominal conditions of operation of the cell;

FIG. 3 shows a partial longitudinal section of a second embodiment of an assembly comprising a storage cell and a detection system according to the invention in nominal conditions of operation of the cell;

FIG. 6 is a block diagram illustrating a method for detecting venting of a cell according to the invention;

FIG. 7 shows a detection system for venting of a storage cell according to the invention;

FIG. 8 shows a plurality of detection systems having a common board in apparatus according to the invention;

In the various diagrams, like elements are designated by identical references. In addition, the various elements are not necessarily shown to scale in order to present a view that facilitates understanding of the invention.

DETAILED DESCRIPTION OF PREFERRED EMBODIMENTS

Figure 1:
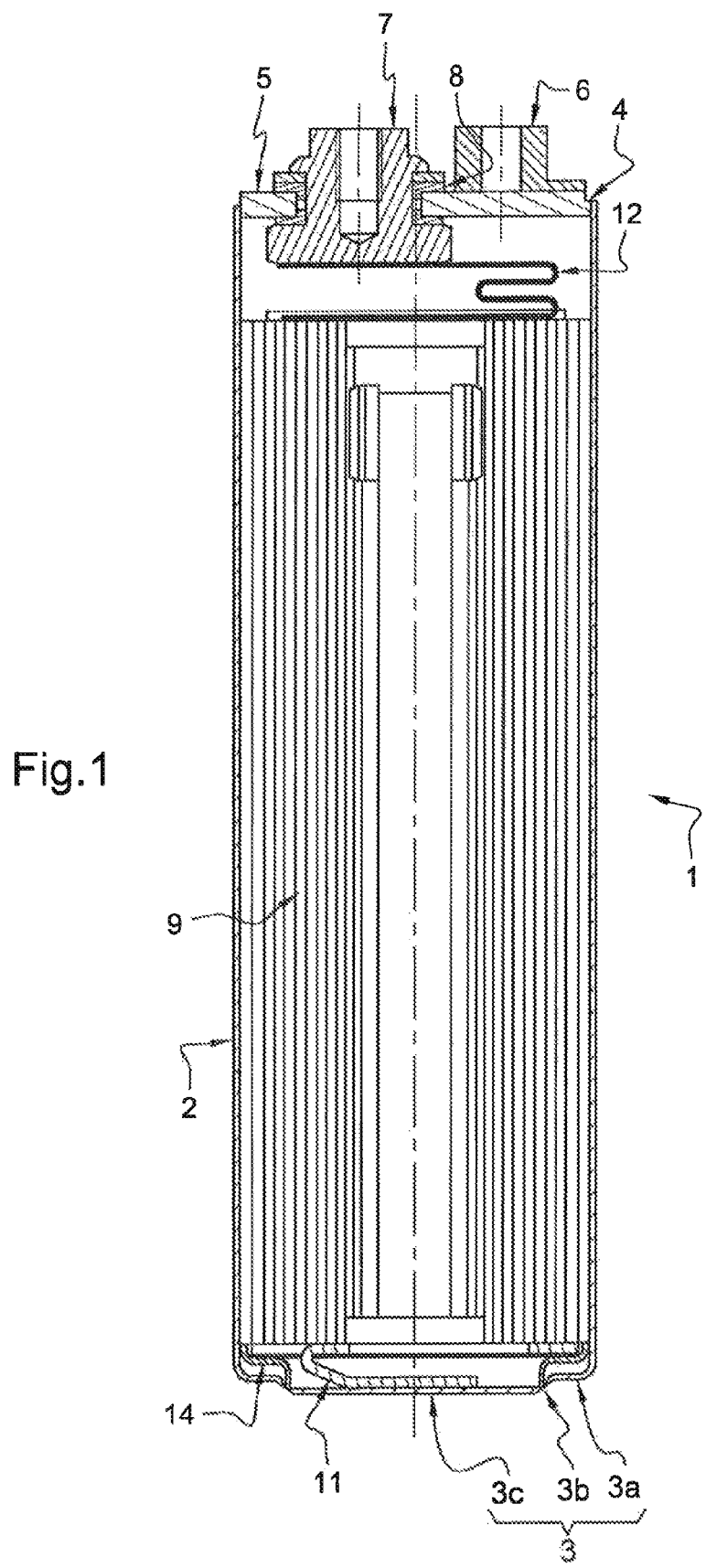
FIG. 1 shows a sectional view of a sealed storage cell with a safety device according to the prior art.

A detection system according to the invention shown in FIG. 2 is arranged to cooperate with a sealed storage cell. FIG. 2 illustrates a first embodiment of an assembly 20 comprising a sealed storage cell 1 and a detection system 24.

The sealed storage cell 1 comprises a container 2 comprising a movable member. The movable member is adapted to be detached from the rest of the container and to move, for example a few millimeters, when there is an overpressure of gas within the container 2 and thus to enable the venting of sealed storage cell 1.

In the various embodiments described below, the formats of the container 2 and of the movable member are cylindrical, but it will be understood that the invention is applicable to other container and/or moving parts formats, such as parallelepiped (or prismatic).

Furthermore, in the following description, the container 2 of the sealed storage cell 1 has a side wall 2 closed by a bottom 3 at one of its ends. The bottom wall of the container comprises a peripheral portion 3a connected to the side wall, a sealing cap 3c and a weakened portion 3b around the seal joining the sealing cap to the peripheral portion. The sealing cap 3c forms the movable member adapted to move when there is an overpressure of gas within the container.

In the various embodiments described below, the movable member or sealing cap 3c is arranged in the bottom of the container but it will be understood that the invention is applicable to other movable parts or sealing caps arranged for example in a lid or on a side wall of the container.

The venting detection system 24 for the sealed storage cell comprises a printed circuit board 30 fixed to the container 2 at a fastening distance less than the maximum distance limit of travel of the sealing cap 3c. Preferably, the printed circuit board 30 is fixed to the container at a distance less than or equal to 70% of the maximum distance or limit of movement of the sealing cap 3c. Mounting distance here means the mean distance, along the axis of movement of the sealing cap 3c, between the planes defined by, on the one hand the sealing cap 3c and on the other hand the printed circuit board 30.

For example, the printed circuit board 30 is in contact with and contiguous to the sealing cap 3c.

To this end, the detection system 24 comprises means for fixing the printed circuit board 30 to the container 2 at a predetermined mounting distance dependent on the distance of movement of the movable member.

The printed circuit board 30 is made of insulating material. It comprises a central portion 32, a peripheral portion 34 surrounding the central portion 32 and a conductive printed track 36.

The central portion 32 is delimited by a substantially circular circumference 38 and is designed to be located facing the sealing cap 3c.

The central portion 32 has substantially the same dimensions as the cell 1. The ratio of the mean diameter of the central portion to the mean diameter of the movable member is between 0.5 and 2. For example, for a cell of 54 mm diameter, the central portion has a diameter substantially equal to 54 mm for a sealing cap diameter of 43 mm. Obviously, the invention is applicable to other shapes and other shapes of the central portion, such as polygonal shapes for example a hexagonal shape.

The peripheral portion 34 is connected to the central portion 32 by connection means consisting of a hinge 40 and at least one frangible portion 42.

Preferably, the central portion 32 and the peripheral portion 34 are connected through continuity of material by the connecting means for a distance less than or equal to 25% of the periphery of the central portion 32. The remaining distance of the periphery of central portion 32 may be a thinned portion or advantageously, because of its ease of manufacture, a portion with cutouts.

The hinge 40 is adapted to flex during movement of the sealing cap 3c.

For example, a cut out line of dots forms the hinge 40 along a straight median line connecting the two ends of the hinge 40. The spacing and size of the holes forming the cut out line of dots forming the hinge is arranged such that the hinge 40 flexes during movement of the sealing cap 3c, preferably without breaking. For example, the dots forming the hinge 40 have a diameter of 0.35 mm, and they are arranged in groups. Two consecutive centers of the same group are spaced 0.25 mm apart and two consecutive centers of two separate and consecutive groups are spaced apart by 1.15 mm.

The or each frangible portion 42 is adapted to break upon displacement of the sealing cap 3c.

For example, a dotted line of cut out holes defines each frangible portion 42, the spacing and size of the holes forming the dotted line where the frangible portion should break being constructed so that the frangible portion 42 may break during the movement of the sealing cap 3c. For example, the holes of the dotted line forming frangible portion 42 have a diameter of 0.35 mm and are spaced 1.15 mm apart.

Furthermore, the hinge and the frangible portion or portions are spaced angularly by an angle substantially equal to 180°, that is to say equal to 180°±20°.

The electrical track 36 connects the peripheral portion 34 to the central portion 32, passing through both the hinge 40 and at least one frangible portion 42.

The electrical track 36 has two ends each situated on the peripheral portion 34 each connected to a terminal. The first terminal is set at a predetermined voltage, e.g. 12 V and the second terminal is connected to a ground of the electrical circuit, which is 0 V. Thus, the circuit comprising the two polarized terminals and the electrical track is adapted to drive a relay type system.

The electrical track 36 is for example of copper.

In addition, the electrical track 36 is adapted to break upon rupture of the frangible portion 42 through which it passes during the movement of the sealing cap 3c. The width of the electrical track is, for example, 150 μm.

In a known manner, the electrical track may be arranged on the face of the printed circuit board 30 facing the movable member or on the opposite face or within the thickness of the printed circuit board 30.

In addition, the thickness of the printed circuit board 30 is between 0.1 mm and 2 mm, for example 0.8 mm in the case under discussion, to allow breaking of the frangible portions and folding of the hinge upon sealing cap 3c shifting by a few millimeters in the presence of an overpressure.

In addition, the fixing means are adapted to maintain the peripheral portion of the printed circuit board in place during venting induced by an overpressure in the container. For example, the fixing means comprise plastic rivets.

According to a second embodiment of an assembly 20 comprising a sealed storage cell 1 and a detection system 24, the sealed storage cell 1 further comprises a deformable membrane 10 as shown in FIG. 3.

The deformable membrane 10 comprises a central portion 10b and a peripheral portion 10a in the form of a disk, but it will be understood that the invention is applicable to other forms compatible with the shape of the container sealing cap 3c.

The boundary between the central portion 10b and the peripheral portion 10a of the deformable membrane 10 is substantially coincident with the weakened portion 3b of the bottom wall of the container 2 and secondly, the peripheral portion 10a of the membrane substantially coincides with the peripheral portion 3a of the bottom wall of the container.

According to an alternative embodiment to allow a sealed storage cell to function as a circuit breaker as indicated above, the deformable membrane 10 is of electrically conductive material to enable conduction of current between the electrodes and the sealing cap 3c. In addition, the central portion 10b is in electrical contact with the electrodes of the same polarity of the electrode plate group. This electrical contact can be obtained by welding of the membrane to the surface of the ends of the foils of these electrodes not covered with active material.

The surface of the deformable membrane may comprise weakened portions, for example in the form of thinned portion that can take different forms. The thickness of the thinned portion is calculated to cause a tear of the thinned portion when the pressure inside the container of the storage cell exceeds a predetermined threshold value, for example 15 bars.

Moreover, according to the embodiment illustrated in FIG. 3, the storage cell comprises a connection part 11 positioned between the end of the electrodes of the same polarity at the bottom of the container 2 and the deformable membrane 10. The connecting part 11 is flexible and comprises:
- a connecting portion 11a adapted to be electrically connected to the electrode foils protruding from an end of the electrode plate group,
- a central portion 11b adapted to be fixed to the deformable membrane, and
- flexible thin strips which are identical, connecting the central portion 11b to the connecting portion 11a.

The term flexible connecting part should be taken to mean a part deforming when pressure pushes the sealing cap 3c outwardly, the connection part 11 being integral with the sealing cap 3c.

The thin strips follow a spiral pattern, that is to say, they have a curved shape that progressively moves away from central portion 11b. The thin strips are evenly distributed around the central portion 11b. The thin strips can follow a spiral path turning to the right or to the left.

Such strips of this kind render the central portion movable with respect to the connecting portion with the central portion performing a helical movement the axis of which passes through the center of the central portion. Thanks to this helical movement effected by the connecting part, the sealing cap 3c, after tearing of the thinned portion, finds itself in a position substantially parallel to its position prior to rupture of the thinned portion. The sealing cap is guided upon tearing of the weakened portion. Thanks to the helical guiding movement effected by the connecting part on the sealing cap, breaking of the weakened portion all around the sealing cap takes place entirely. As a result, disconnection of the sealing cap from the peripheral part is guaranteed. This ensures that the sealing cap will no longer be in contact with the peripheral portion.

Therefore, this second embodiment provides a good guarantee of disconnection between the electrodes of one polarity and the associated current output terminal.

The operation and advantages of the membrane will be detailed below.

Figure 4:
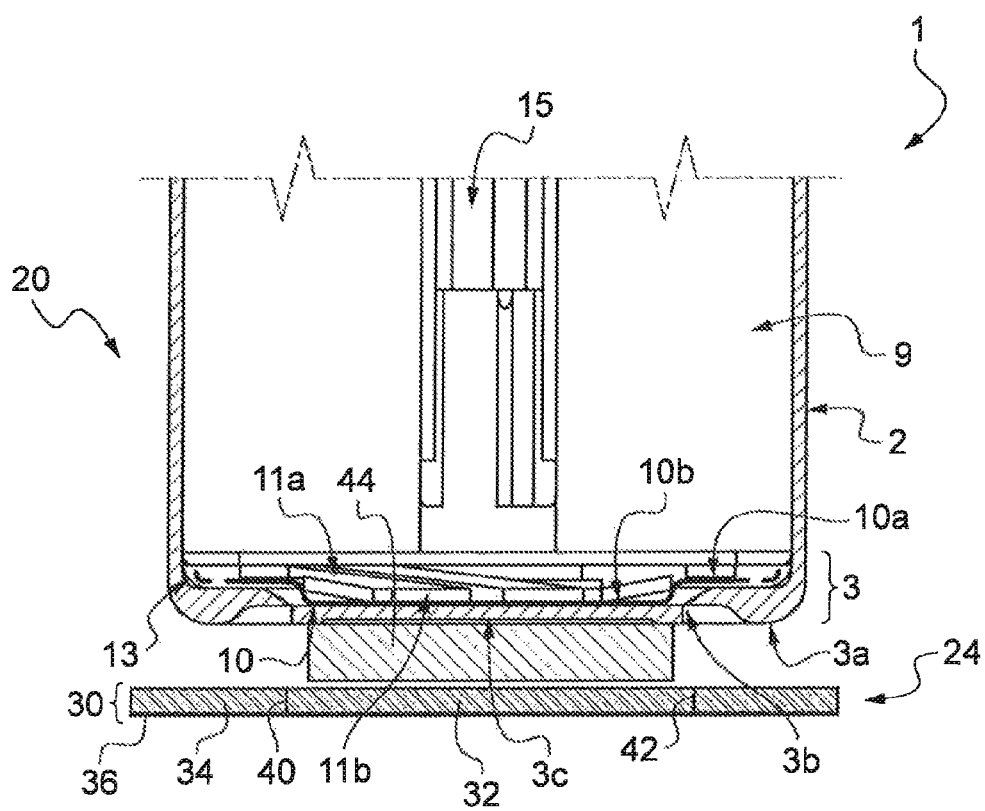
FIG. 4 shows a partial longitudinal section of a third embodiment of an assembly comprising a storage cell and a detection system according to the invention in nominal conditions of operation of the cell.

According to a third embodiment shown in FIG. 4, the detection system 24 is identical to the second embodiment and differs in that it further comprises a rigid spacer 44 ensuring contact between the movable member or sealing cap 3c of the container and the central portion 32 of the printed circuit board 30.

Obviously, such a rigid part or spacer 44 may also be used in the case of the first embodiment.

Figure 5:
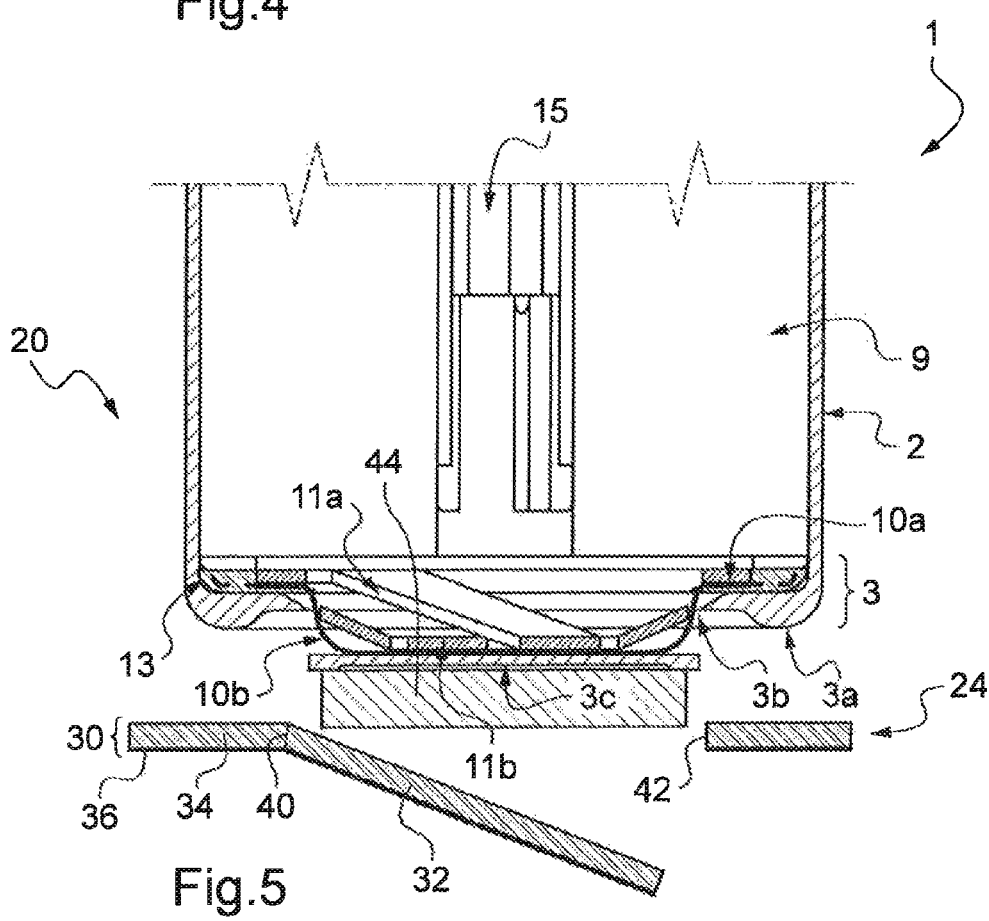
FIG. 5 shows a partial longitudinal section of an assembly of FIG. 4 after rupture of the thinned portion and detachment of the sealing cap from the bottom of the container.

The operation of the storage cell in case of increase of internal pressure will now be described in relation to FIGS. 5 and 6 as well as the venting detection method implemented by a detection system as described above.

Overpressure of gas within the container 2, in the event of malfunction of the sealed storage cell 1, creates a pushing force on the movable member i.e. the sealing cap 3c outwardly of the container 2. The pushing force causes the rupture of the weakened portion, during a step 60. The weakened portion, which may be a thinned portion is in fact designed to rupture, that is to say tear.

The pushing force exerted on the sealing cap 3c coupled with the rupture of the membrane causes the sealing cap 3c to travel a distance of a few millimeters, at step 62.

This pushing force exerted on sealing cap 3c during its movement gets transmitted in the form of another pushing force directed along its axis of movement to the central portion 32 of the printed circuit board 30 either directly or via the spacer 44 depending on the embodiment concerned, during step 64.

The force now being exercised on detection system 24 as a result of this further pushing force on central portion 32 along with the peripheral part being held in a fixed position, causes the rupture of the or each frangible portion 42 and in particular of the frangible portion 42 through which electrical track 36 passes. This further pushing force also causes deformation and bending of hinge 40 of the detection system, at step 66.

Tests carried out by the assignee have shown that a thickness of printed circuit board 30 substantially equal to 0.8 mm allows the breaking of the frangible portion 42 and the bending of the hinge 40 at a pressure of gas in the container of 8 bar and consequent breakage of the electrical path between the two terminals located at the ends of the electrical printed track.

Obviously, the dimensioning of the various components of the detection system and the storage cell according to other embodiments, for example to obtain a venting at another threshold pressure within the container is perfectly within the scope of the person skilled in the art.

Additionally and optionally, the breaking of the electrical track 30 can trigger a warning signal, for example visual or audible, informing of breaking of the electrical track 30.

In the case of the second embodiment, the presence of the deformable membrane 10 has the effect of retaining gases resulting from electrochemical reactions inside the container. The membrane forces the gas to exert a uniform pressure on the sealing cap until it tears completely. In the absence of the membrane, as soon as the sealing cap opens, the gases evacuate out of the container of the storage cell and the pressure on the sealing cap would fall, which might not allow complete opening of the sealing cap. The deformable membrane thus keeps the container airtight after tearing of the sealing cap. The rupture of the or each frangible portion 42 and bending the hinge 40 allows it to be readily detected visually whether the cell 1 has undergone venting of the container 2 due to an overpressure of the gas inside it.

In addition, this detection results from a combination of mechanical effects and does not require any source of electrical power.

In addition, this detection makes it possible to determine whether the voltage drop across the terminals of a sealed cell, comprising a safety device such as that shown in FIG. 1 and described above, is the result of excess pressure or not. Indeed, when the storage cell comprises a safety device having a circuit breaker function in case of overpressure, the sealing cap is no longer electrically connected to the peripheral portion of the container base when venting occurs. Conduction of current between the deformable membrane and the current output terminal is thus broken. However, a drop in voltage from the storage cell can also occur even in the absence of excess pressure, e.g. a defective welded joint. In the case of the invention, the detection system can discriminate whether the voltage drop is or is not the result of excess pressure in the container of the storage cell.

Moreover, if the electrical printed track of the detection system is connected in series with a power source and a resistor, the voltage across the latter will reflect the status of the electrical track which acts as a switch. Indeed, in the absence of venting, the electrical track is continuous and the switch corresponding thereto is closed so that the voltage across the resistor is equal to that supplied by the voltage source. On the contrary, when venting occurs, the electrical track is broken so that the corresponding switch is opened and the voltage across the resistor then instantly falls to zero upon breaking of the electrical track.

FIG. 7 illustrates a preferred embodiment of a venting detection system 24 according to the invention. The printed circuit board 30 of the detection system 24 is fixed to the container 2 (not shown) of the storage cell by fixing means 50 adapted to hold the peripheral portion 34 of the printed circuit board 30 in place during venting brought about by overpressure in the container. In the embodiment illustrated, the attachment means 50 comprise plastic rivets.

The central portion 32 of the printed circuit board 30 comprises a disc 52 extended by a tab 54 through which the electrical track 36 passes. The longitudinal axis of tab 54 is tangential to the disc 52.

The disc 52 is designed to face sealing cap 3c and has substantially the same footprint as the cell 1.

The peripheral portion 34 is connected to the central portion 32 by connection means consisting of a hinge 40 and at least one frangible portion 42.

The peripheral portion 34 is connected by material continuity to disc 52 by means, on the one hand, of hinge 40 and on the other by the tab 54.

In the example illustrated in FIG. 7, the tab 54 has two parts 42 each formed to be frangible along a dotted line of intended breakage each arranged near one end of the tab. Each frangible portion 42 is adapted to break upon displacement of the sealing cap 3c.

The electrical track 36 connects the peripheral portion 34 to the central portion 32 by passing through both the hinge 40 and by the two frangible portions 42 of the tab.

The hinge 40 and the tip of tab 54 tangent to disk 52 are diametrically opposite. In this case, the hinge 40 and each frangible portion 42 are spaced angularly by an angle substantially equal to 180° relative to the geometric center of the disc 52, that is to say, by an angle equal to 180°±20°.

Advantageously, the axis of the line of lines of dots forming the hinge 40 is perpendicular to the axis of each of the lines of intended breakage forming the frangible portion 42.

Such an arrangement ensures more efficient breaking of at least one frangible portion of the detection system 42 at the tab by exerting a twisting effect in order to obtain tearing of the tab at at least one of the frangible portions.

According to another preferred embodiment of the venting detection system, the connecting means consist of a hinge 40 and a single frangible portion 42. In this case, the hinge 40 and the single frangible portion 42 are advantageously spaced angularly by an angle substantially equal to 180° relative to the geometric center of the central portion 32. Obviously, the hinge 40 and the single frangible portion 42 can be spaced by an angle of less than 180° relative to the geometric center of the central portion.

The invention also provides apparatus comprising at least two of the assemblies 20 as described above. The sealed cells 1 are electrically connected in parallel and the detection systems 24 are electrically connected in series.

In addition, the detection system printed circuit boards form a single common board 30 whose electrical printed tracks 36 are electrically connected in series to form a single continuous track between a first terminal A and a second terminal B.

For example, the apparatus comprises a housing in which there are arranged regularly a number of sealed storage cells 1 and one single board 30, fixed and held onto the housing by plastic rivets.

Figure 9:
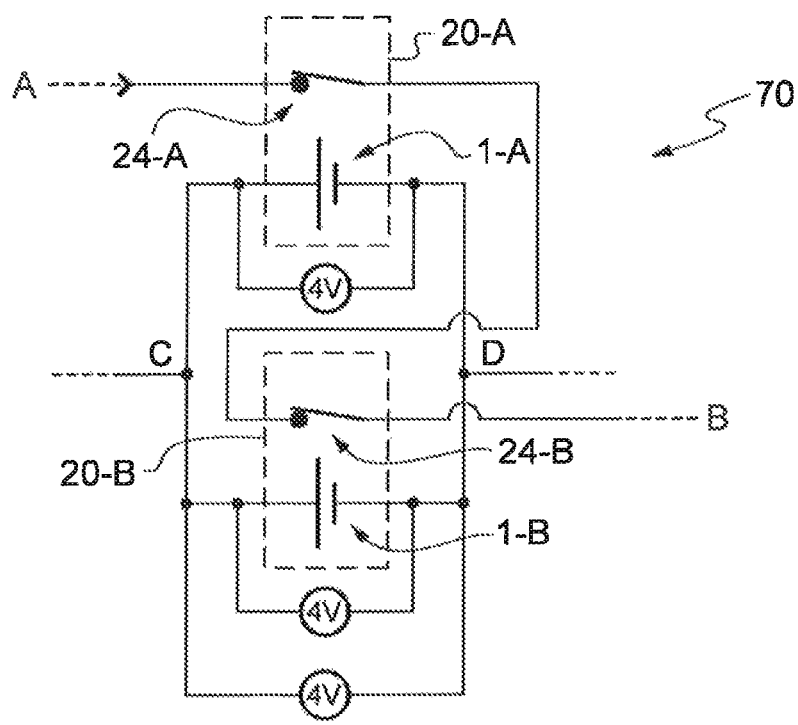
FIG. 9 is an equivalent circuit diagram of apparatus comprising two assemblies according to the invention in nominal operating conditions.

An example of such apparatus 70 is shown in FIG. 8. This apparatus comprises 44 detection systems connected to each other electrically in series via the electrical track between the first and second terminals A, B. Each detection system 24 is arranged to face the movable member i.e. the sealing cap 3c of a sealed storage cell 1. FIG. 9 is an equivalent circuit diagram for two assemblies of the apparatus of FIG. 8 in use under nominal conditions. The first and second assemblies identified respectively by reference numerals 20-A, 20-B comprise a storage cell 1-A, 1-B and a detection system 24-A, 24-B.

Both storage cells 1-A, 1-B are connected in parallel and the two detection systems are connected electrically in series.

As illustrated in FIG. 9, under nominal conditions of use for the two storage cells 1-A, 1-B, the terminal voltage of each storage cell is not zero, for example, 4 V, and the voltage between the negative terminal C common to the storage cells and the positive terminal D common to the cells is also non-zero.

Each central portion of a detection system 24-A, 24-B is respectively connected to each peripheral portion, since there is no excess pressure in the two storage cells. Continuity of the electrical track connecting the first and second terminals A and B is ensured.

Figure 10:
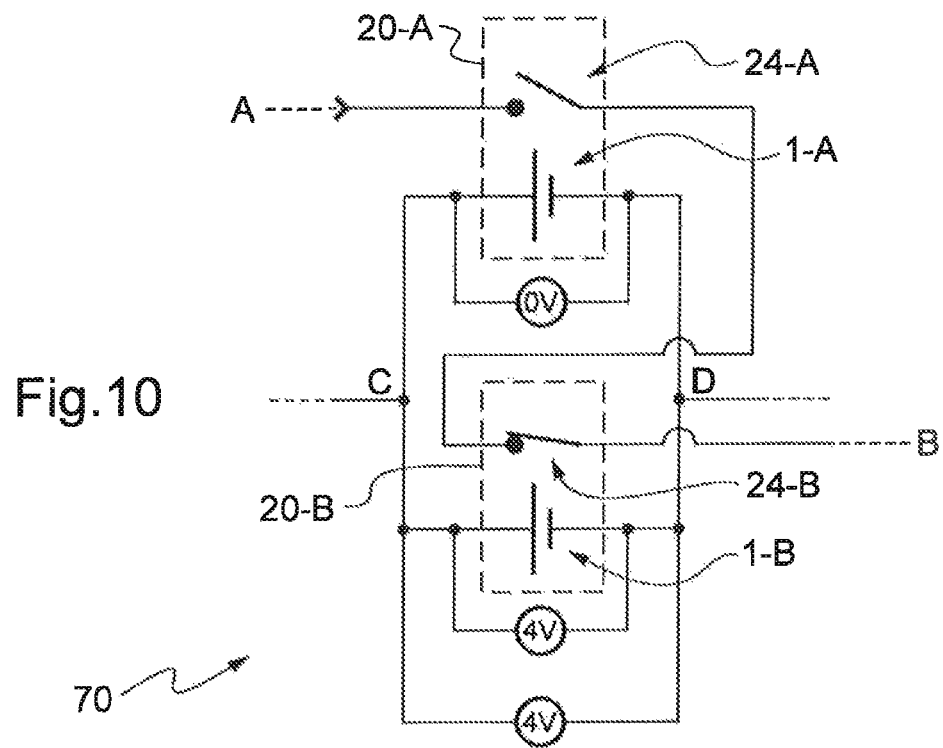
FIG. 10 is an equivalent circuit diagram of the apparatus of FIG. 9 in operation and after a failure of one of the two storage cells.

FIG. 10 shows the same assemblies as in FIG. 9, with the exception that one storage cell 1-A is no longer operating under nominal conditions and was subject to increase of gas pressure inside the container causing venting thereof. This is symbolized by zero voltage across cell 1-A.

As storage cells 1-A and 1-B are connected in parallel, the voltage between the negative terminal C common to the cells and common positive terminal D remains non-zero as the other cell 1-B is functioning normally. Thus it is not clear that there has been a failure of storage cell 1-A. Nevertheless, detection system 24-A does make it possible to detect venting of storage cell 1-A as the circuit is broken as central portion 32-A is no longer in its original position, that is to say connected to the peripheral portion by both the hinge and the frangible portion.

It will be readily understood that malfunction due to excess pressure in apparatus 70 comprising a plurality of assemblies 20 is easily detected by such a set of detection systems 24.

Indeed, in case of overpressure a warning signal may be issued as indicated above and visual observation of the printed circuit board can then quickly determine which cell has been subject to overpressure inside its container.

Obviously, the present invention is not limited to the examples and embodiments described and illustrated but is capable of numerous variations available to the skilled person.

The invention claimed is:

1. An assembly, comprising:
a sealed storage cell; and
a venting detection system for the sealed storage cell,
the sealed storage cell comprising a container including a movable member adapted to be detached from the rest of the container and to move in the presence of excessive gas pressure within the container to allow the venting of said sealed storage cell,
the venting detection system comprising a printed circuit board including:
a central portion delimited by a circumference designed to be situated facing said sealing cap
a peripheral portion surrounding the central portion and connected to said central portion by connecting means comprising:
a hinge adapted to flex during movement of the movable member, and
at least one frangible portion adapted to break upon movement of the movable member,
an electrical printed track connecting said peripheral portion to the central portion through the hinge and at least one frangible portion, the electrical printed track being adapted to be broken through breaking of the frangible portion upon movement of the movable member.

2. The assembly according to claim 1, wherein the central portion and the peripheral portion are connected by continuity of material by the connecting means over a distance less than or equal to 25% of the circumference of the central portion.

3. The assembly according to claim 1, wherein the hinge and the frangible portion or portions are angularly spaced by an angle substantially equal to 180° relative to a geometric center of the central portion.

4. The assembly according to claim 1, wherein a line of cut out dots forms the hinge following a mean straight line connecting two ends of the hinge.

5. The assembly according to claim 1, wherein the frangible portion includes a line of cut out holes.

6. The assembly according to claim 5 wherein a line of cut out dots forms the hinge following a mean straight line connecting the two ends of the hinge, and wherein the line of cut out dots forming the hinge and the line of cut out dots forming the frangible portion are perpendicular one with respect to the other.

7. The assembly according to claim 1, wherein the shape of the central portion is circular or hexagonal.

8. The assembly according to claim 1, comprising a spacer designed to ensure contact between the sealing cap of the container and the central portion of the printed circuit board.

9. The assembly according to claim 1, wherein the thickness of the printed circuit board is between 0.1 and 2 mm.

10. The assembly according to claim 1, wherein the central portion comprises a disc extended by a tab, the tab having two frangible portions and being connected through continuity of material to the peripheral portion, the electrical printed track passing through the tab.

11. The assembly according to claim 1, wherein the sealed storage cell comprises a deformable membrane adapted to deform when there is excess pressure of gas within the container, deformation thereof causing the movable member to become detached from the rest of the container.

12. An apparatus comprising at least two assemblies of claim 1, wherein the sealed cells of the assemblies are electrically connected in parallel, the detection systems of the assemblies are electrically connected in series, the printed circuit boards of the detection systems forming a single common board.

13. A venting detection method of an assembly according to claim 1, the method comprising the steps of:
permitting mechanical movement of the movable member in the presence of excess pressure inside the container, and
simultaneously upon movement of the movable member permitting folding of the hinge and breaking of the frangible portion thereby bringing about breaking of the electrical printed track.

14. The venting detection method of claim 13, characterized in that the breaking of the electrical printed track triggers a warning signal informing of the breaking of the electrical printed track.

* * * * *